US011598911B1

United States Patent
Moe et al.

(10) Patent No.: US 11,598,911 B1
(45) Date of Patent: Mar. 7, 2023

(54) TRANSPORTING LIGHT WITHIN CIRCUIT BOARD PROFILE

(71) Applicant: Arista Networks, Inc., Santa Clara, CA (US)

(72) Inventors: Matthew Albert Moe, San Jose, CA (US); Robert Morris Wilcox, Saratoga, CA (US); Richard Neville Hibbs, Redwood City, CA (US); Tiong Khai Soo, Milpitas, CA (US); Xing Wang, San Jose, CA (US); James Dennis MacDonald, Campbell, CA (US); Clifford Bryant Willis, Pleasanton, CA (US)

(73) Assignee: Arista Networks, Inc., Santa Clara, CA (US)

( * ) Notice: Subject to any disclaimer, the term of this patent is extended or adjusted under 35 U.S.C. 154(b) by 9 days.

(21) Appl. No.: 17/463,126

(22) Filed: Aug. 31, 2021

(51) Int. Cl.
*G02B 6/00* (2006.01)
*F21V 8/00* (2006.01)
*H05K 1/02* (2006.01)
*H05K 1/18* (2006.01)

(52) U.S. Cl.
CPC ......... *G02B 6/0008* (2013.01); *G02B 6/0006* (2013.01); *H05K 1/0274* (2013.01); *H05K 1/181* (2013.01); *H05K 2201/10106* (2013.01); *H05K 2201/10446* (2013.01); *H05K 2201/10674* (2013.01)

(58) Field of Classification Search
CPC .................................................... G02B 6/0008
USPC ........................................................ 361/760
See application file for complete search history.

(56) References Cited

U.S. PATENT DOCUMENTS

| 5,988,842 A * | 11/1999 | Johnsen | G02B 6/0008 362/85 |
| 6,463,204 B1 * | 10/2002 | Ati | G02B 6/0008 385/146 |
| 2019/0069403 A1 * | 2/2019 | Heikkinen | H05K 1/0274 |

* cited by examiner

Primary Examiner — Stanley Tso (57) ABSTRACT

Embodiments described herein relate to a system for positioning indicator lights of a network device. The system may include a circuit board, which may include a circuit board edge positioned behind a front panel of the network device, two surfaces; and a side of the circuit board edge positioned between the two surfaces. The system may also include a hole through the circuit board near the circuit board edge, a cutout extending from a portion of the hole to the side of the circuit board edge, a LED coupled to the surface of the circuit board and adapted to emit light into the hole, and a lightpipe disposed in the hole to receive light emitted from the LED into a first end of the lightpipe. The lightpipe may direct the light from a second end of the lightpipe toward an opening in the front panel of the network device.

20 Claims, 5 Drawing Sheets

TRANSPORTING LIGHT WITHIN CIRCUIT BOARD PROFILE

BACKGROUND

Network devices often include indicator lights on the front panel. Such indicator lights may convey any sort of information about the network device, or any component therein, to a user of the network device. As an example, an indicator light may provide a status of a particular component based on the color of the light emitted, the presence or lack of blinking, the rate at which the light cycles on and off, etc. However, implementing such lights often requires mechanical infrastructure that is located in locations that interfere with or otherwise adversely affect other components of a network device. Moreover, the placement of the indicator lights on the exterior of the device may use space or have other requirements that reduce the amount of space on the exterior of the network device that could be used for other purposes.

DETAILED DESCRIPTION

Specific embodiments will now be described with reference to the accompanying figures.

In general, embodiments described herein relate to techniques and systems for implementing network device indicator lights that extend from a side of a circuit board within the network device.

Conventionally, indicator lights are often located on the front panel of network devices. To get light to this location often requires a variety of components, such as light emitting diodes (LEDs), mount holes, shrouds, lightpipes, etc. Such a configuration presents various problems. First, the holes and mechanical parts require keep out areas on a circuit board, which other components must avoid. Thus, valuable area of a circuit board of a network device must be used for such an implementation. When designing the layout of the circuit board, this leads to less area for components that are critical to the functioning of the network device, making the design process more challenging, and may force the use of longer signal traces, which may negatively impact signal integrity. Additionally, the indicator lights on the front panel use space that could otherwise be used (e.g., as openings) to improve airflow through the network device, which would provide additional cooling for the components therein (i.e., improved thermal management).

The present disclosure addresses the above-described problems with conventional implementations of indicator lights. Specifically, in one or more embodiments, the shroud(s) are eliminated, the LEDs and lightpipes are moved to otherwise unused edge portions of the circuit board, and additional portions of the front panel of a network device are available to have openings to improve airflow through the network device.

More specifically, in one or more embodiments, the LEDs are reverse-mounted LEDs, which are mounted, using surface mounting technology, to the top surface of the circuit board into holes located near the edge of the circuit board, which is otherwise not used (e.g., for components or signal traces). In one or more embodiments, the LEDs are reverse-mounted so that the light therefrom is emitted into the circuit board instead of up from (or down from) the circuit board. In one or more embodiments, the holes into which the LEDs are mounted extend through the circuit board, and at least a portion of the holes are adjacent to another cutout from the edge of the circuit board to the hole.

In one or more embodiments, lightpipes are also used. In one or more embodiments, the lightpipes are constructed such that they receive light from an LED in one end in a first direction, and through the use of optical technology (e.g., mirrors), they redirect the light in another direction and out of the other end of the lightpipe. For example, light emitted from an LED may enter one end of the lightpipe, travel a short distance, reflect off of a mirror positioned to reflect the light at a 90-degree angle, and then travel a longer distance out of the other end of the lightpipe. In one or more embodiments, such lightpipes may be pressed (e.g., during manufacturing) into the circuit board from a circuit board surface that is opposite from the circuit board surface where a corresponding LED is mounted, such that the light emitted from the LED travels into one end of the lightpipe and is reflected out of the other end of the lightpipe. In one or more embodiments, the portion of the lightpipe that is parallel with the circuit board surface, and out of which light is emitted, extends through the aforementioned additional cutouts from the hole in which the LED is positioned to the edge of the board and beyond, while remaining within the profile of the side of the circuit board. In one or more embodiments, such portions of the lightpipe(s) extend to or through the front panel of a network device, thereby providing indicator lights for the network device.

In one or more embodiments, lightpipes may be produced as single lightpipes, or as sets of two or more mechanically coupled lightpipes to allow for pressing the lightpipes into the underside of the circuit board as a set. In one or more embodiments, additional features may be used, such as additional features of the hole in which the light from the LED enters the lightpipe, that prevent the lightpipe from dislodging the LED when the lightpipes are pressed into the circuit board (e.g., during manufacturing).

In one or more embodiments, with such a configuration, the LEDs and lightpipes are attached to the circuit board at the edge of the circuit board, which is generally unused, and thus away from other components that are critical to the functioning of the network device. In one or more embodiments, the end of the lightpipes from which the light from the LEDs extends directly away from the edge of the circuit board, and may be attached to corresponding holes in the front panel of the network device that are aligned with the circuit board therein.

In one or more embodiments, the above-described configuration effectively uses the body of the circuit board as a shroud, thereby eliminating the need for other shrouds. Additionally, in one or more embodiments, the area of the front panel where the indicator lights exist is at the level where the circuit board exists inside the network device, which, based on the presence of the circuit board, could not provide much additional airflow through the network device if openings existed at that location. In one or more embodiments, the area where the indicator lights existed prior to embodiments described herein becomes available to have openings to enhance airflow for a network device, thereby improving the thermal management of the device. In one or more embodiments, the location of the LEDs and the light-pipes at the previously unused edge of the circuit board simplifies the design process and shortens trace lengths for other components on the circuit board that are critical to the functioning of the network device.

Figure 1:
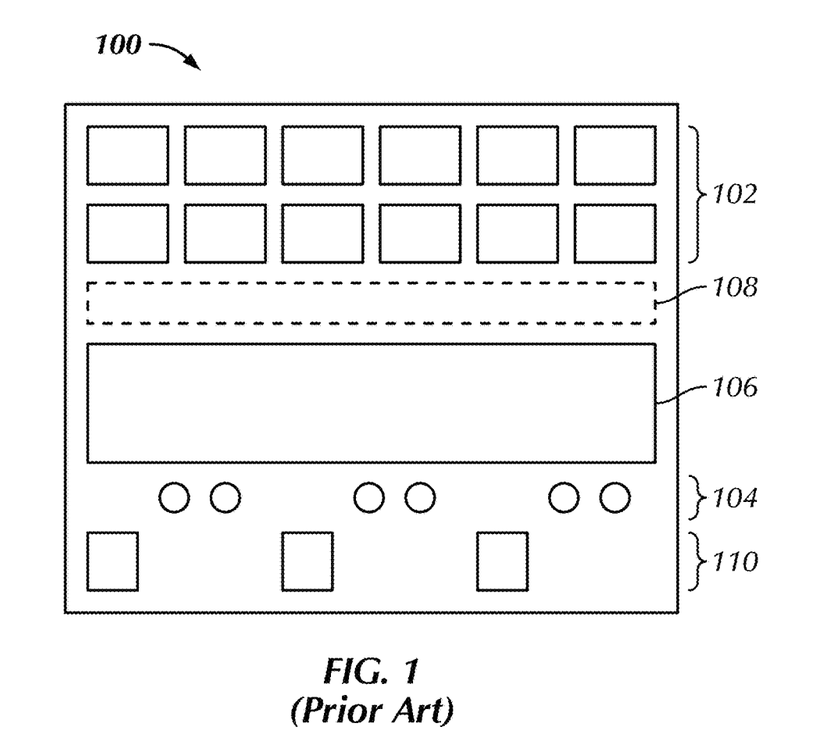
FIG. 1 shows a front view of a prior art network device.

FIG. 1 shows a front view of a prior art network device. The devices/components shown in FIG. 1 and described below are each only one example of a particular device/component. One having ordinary skill in the art, and the benefit of this Detailed Description, will appreciate that the techniques described herein may apply to any number of different devices. Accordingly, embodiments described herein should not be considered limited to devices/components shown in FIG. 1.

As shown in FIG. 1, the network device (100) includes airflow openings (102), indicator lights (104), circuit board profile (108), other components (106), and additional airflow openings (110). Each of these components is described below.

In one or more embodiments, a network device (100) is a physical device that includes and/or is operatively connected to persistent storage (not shown), memory (e.g., random access memory (RAM)) (not shown), one or more processor(s) (e.g., integrated circuits) (not shown), and at least one physical network interface (not shown). Examples of a network device (100) include, but are not limited to, a network switch, a router, a multilayer switch, a fibre channel device, an InfiniBand® device, etc. A network device is not limited to the aforementioned specific examples.

In one or more embodiments, a network device also includes any number of additional components (not shown), such as, for example, circuit boards, network chips, field programmable gate arrays (FPGAs) (not shown), application specific integrated circuits (ASICs) (not shown), indicator lights (not shown), fans (not shown), clocks (not shown), etc. In one or more embodiments, all or any portion of such components may require at least some cooling to be provided at certain times.

In one or more embodiments, a network device includes functionality to send and/or receive packets (or other network traffic data, such as, e.g., frames, etc.) at any of the physical network interfaces (i.e., ports) of the network device and to process the packets. In one or more embodiments, processing a packet includes, but is not limited to, a series of one or more table lookups (e.g., longest prefix match (LPM) lookups, forwarding equivalence class (FEC) lookups, etc.) and corresponding actions (e.g., forward from a certain egress port, add a labeling protocol header, rewrite a destination address, encapsulate, etc.). Examples of packet processing include, but are not limited to, performing a lookup to determine: (i) whether to take a security action (e.g., drop the network traffic data unit); (ii) whether to mirror the network traffic data unit; and/or (iii) how to route/forward the packet in order to transmit the packet from an interface of the network device.

In one or more embodiments, the network device is part of a network (not shown). A network (not shown) may refer to an entire network or any portion thereof (e.g., a logical portion of the devices within a topology of devices). A network may include a datacenter network, a wide area network, a local area network, a wireless network, a cellular phone network, or any other suitable network that facilitates the exchange of information from one part of the network to another. A network may be located at a single physical location, or be distributed at any number of physical sites. In one or more embodiments, a network may be coupled with or overlap, at least in part, with the Internet.

In one or more embodiments, network device (100) includes airflow openings (102). In one or more embodiments, airflow openings (102) are perforations in an exterior of a network device (100). In one or more embodiments, airflow openings (102) allow for air to flow into and/or out of a network device. In one or more embodiments, such airflow through airflow openings (102) is used in thermal management of a network device (100). For example, air flowing through airflow openings (102) may help to provide cooling for components of network device (100).

In one or more embodiments, network device (100) includes circuit board profile (108). In one or more embodiments of the disclosure, a circuit board is any structure that is configured to provide electrical connections between and/or within components (e.g., circuit components, integrated circuitry packages, etc.) that are attached in any way to the circuit board. In one or more embodiments of the disclosure, a circuit board may also provide mechanical support for any such components (e.g., within network device (100)). One non-limiting example of a circuit board is a printed circuit board (PCB). In one or more embodiments, circuit board profile (108) is the side of a circuit board of any thickness. FIG. 1 shows circuit board profile (108) with dashed lines to represent that the circuit board is within network device (100) and, as such, circuit board profile (108) may be behind the front panel of network device (100) shown in FIG. 1. The area on said front panel in front of the circuit board is unused in the example network device (100) shown in FIG. 1. The area may be unused, for example, because it may not be desirable or useful to put any components in that location, and because additional airflow openings in that area would not provide much, if any, additional cooling for network device (100) due to the presence of circuit board profile (108), which would impede or prevent airflow.

As shown in FIG. 1, network device (100) includes other components (106). In one or more embodiments, other components (106) may be any components of network device (100). As an example, other components may be any number of cages used for installing optical transceivers in network device (100).

As shown in FIG. 1, network device (100) includes indicator lights (104). In one or more embodiments, indicator lights (104) are components that emit light. Such light may, for example, be light that originates from an LED (not shown). As an example, an LED may be a semiconductor component that emits light when an electric current passes through it. An LED may emit light of any color. An LED may emit light and not emit light in any alternating pattern. Colors and/or patterns of light emission from LEDs may be used, for example, to provide information to a user of network device (100). For example, indicator lights (104)

coupled to LEDs may be used to indicate the status of any one or more components of network device (100).

As shown in FIG. 1, network device (100) includes additional airflow openings (110). In one or more embodiments, additional airflow openings (110) are similar to airflow openings (102), described above, but are in a different location on the front panel of network device (100).

The example network device shown in FIG. 1 has several problems. First, the area of the front panel in front of circuit board profile (108) is unused. As an example, that portion of the front panel may be sheet metal that has no perforations, as such perforations would only have a limited impact on airflow through network device (100) due to the presence of the circuit board represented by circuit board profile (108). Additionally, the indicator lights (104) used as indicator lights for network device (100) are necessarily located away from the circuit board (below other components in the example shown in FIG. 1). This location is to facilitate the infrastructure, such as shrouds, needed to implement indicator lights (104), which are connected to the circuit board. Moreover, the connections from the circuit board to indicator lights (104) require space (not shown) on the circuit board that could otherwise be used for components and connections used for operation of network device (100). Such connections may also necessitate that the circuit board have longer trace lengths for connecting other components, which may negatively impact signal integrity on the circuit board. Lastly, the presence of indicator lights (104) causes extra space on the front panel to not be used for airflow openings. In the example shown in FIG. 1, there are some additional airflow openings (110), but none immediately near or below indicator lights (104).

While FIG. 1 shows a configuration of components, other configurations may be used that experience the same or similar problems to those described above. Accordingly, embodiments of network devices exhibiting such problems should not be limited to the configuration of components shown in FIG. 1.

Figure 2:
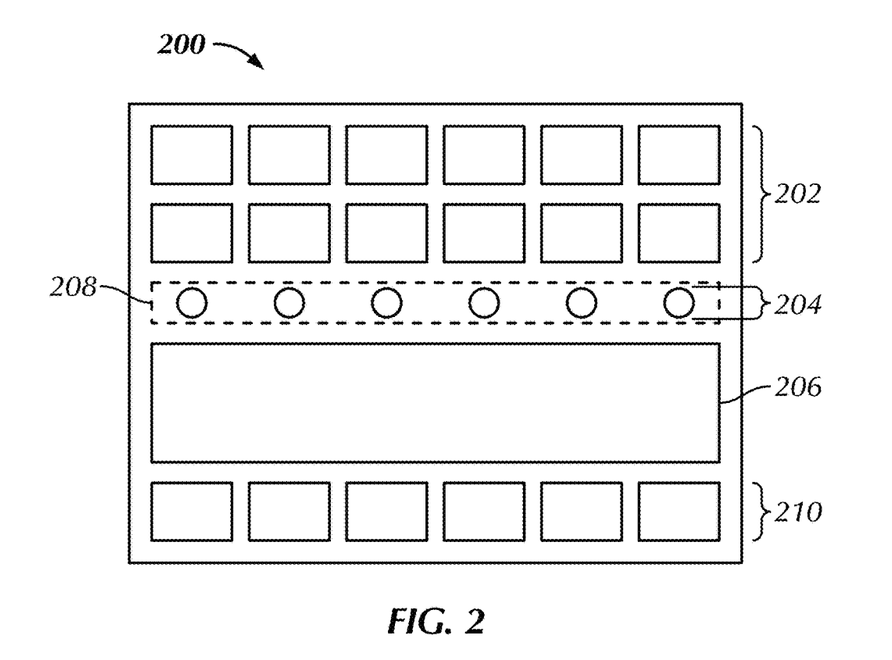
FIG. 2 shows a front view of a network device in accordance with one or more embodiments described herein.

FIG. 2 shows a front view of a network device in accordance with one or more embodiments described herein. The devices/components shown in FIG. 2 and described below are each only one example of a particular device/component. One having ordinary skill in the art, and the benefit of this Detailed Description, will appreciate that the techniques described herein may apply to any number of different devices. Accordingly, embodiments described herein should not be considered limited to devices/components shown in FIG. 2.

As shown in FIG. 2, the network device (200) includes airflow openings (202), indicator lights (204), circuit board profile (208), other components (206), and additional airflow openings (210). Each of these components is described below.

In one or more embodiments, a network device (200) is a physical device that includes and/or is operatively connected to persistent storage (not shown), memory (e.g., random access memory (RAM)) (not shown), one or more processor(s) (e.g., integrated circuits) (not shown), and at least one physical network interface (not shown). Examples of a network device (200) include, but are not limited to, a network switch, a router, a multilayer switch, a fibre channel device, an InfiniBand® device, etc. A network device is not limited to the aforementioned specific examples.

In one or more embodiments, a network device (200) also includes any number of additional components (not shown), such as, for example, circuit boards, network chips, field programmable gate arrays (FPGAs) (not shown), application specific integrated circuits (ASICs) (not shown), indicator lights (not shown), fans (not shown), clocks (not shown), etc. In one or more embodiments, all or any portion of such components may require at least some cooling to be provided at certain times.

In one or more embodiments, a network device (200) includes functionality to send and/or receive packets (or other network traffic data, such as, e.g., frames, etc.) at any of the physical network interfaces (i.e., ports) of the network device and to process the packets. In one or more embodiments, processing a packet includes, but is not limited to, a series of one or more table lookups (e.g., longest prefix match (LPM) lookups, forwarding equivalence class (FEC) lookups, etc.) and corresponding actions (e.g., forward from a certain egress port, add a labeling protocol header, rewrite a destination address, encapsulate, etc.). Examples of packet processing include, but are not limited to, performing a lookup to determine: (i) whether to take a security action (e.g., drop the network traffic data unit); (ii) whether to mirror the network traffic data unit; and/or (iii) how to route/forward the packet in order to transmit the packet from an interface of the network device.

In one or more embodiments, the network device (200) is part of a network (not shown). A network (not shown) may refer to an entire network or any portion thereof (e.g., a logical portion of the devices within a topology of devices). A network may include a datacenter network, a wide area network, a local area network, a wireless network, a cellular phone network, or any other suitable network that facilitates the exchange of information from one part of the network to another. A network may be located at a single physical location, or be distributed at any number of physical sites. In one or more embodiments, a network may be coupled with or overlap, at least in part, with the Internet.

Although FIG. 2 shows a network device, embodiments described herein may apply to any computing device that includes one or more circuit boards, and use LEDs to provide light for indicator lights. In one or more embodiments, a computing device is any device or any set of devices capable of electronically processing instructions and may include, but is not limited to, any of the following: one or more processors (e.g. components that include integrated circuitry) (not shown), memory (e.g., random access memory (RAM) (not shown)), input and output device(s) (not shown), persistent storage, one or more physical interfaces (e.g., network ports) (not shown), any number of other hardware components (not shown) and/or any combination thereof. Examples of computing devices include, but are not limited to, a server (e.g., a blade-server in a blade-server chassis, a rack server in a rack, etc.), a desktop computer, a mobile device (e.g., laptop computer, smart phone, personal digital assistant, tablet computer and/or any other mobile computing device), a network device (e.g., switch, router, multi-layer switch, etc.) such as that described below, a virtual machine executing using underlying hardware components of a physical computing device, and/or any other type of computing device with the aforementioned requirements.

In one or more embodiments, network device (200) includes airflow openings (202). In one or more embodiments, airflow openings (202) are perforations in an exterior of a network device (200). In one or more embodiments, airflow openings (202) allow for air to flow into and/or out of a network device. In one or more embodiments, such airflow through airflow openings (202) is used in thermal management of network device (200). For example, air flowing through airflow openings (202) may help to provide cooling for components of network device (200).

As shown in FIG. 2, network device (200) includes other components (206). In one or more embodiments, other components (206) may be any components of network device (200). As an example, other components may be any number of cages used for installing optical transceivers in network device (200).

In one or more embodiments, network device (200) includes circuit board profile (208). In one or more embodiments of the disclosure, a circuit board is any structure that is configured to provide electrical connections between and/or within components (e.g., circuit components, integrated circuitry packages, etc.) that are attached in any way to the circuit board. In one or more embodiments of the disclosure, a circuit board may also provide mechanical support for any such components (e.g., within network device (200)). One non-limiting example of a circuit board is a printed circuit board (PCB). In one or more embodiments, circuit board profile (208) is the side of a circuit board of any thickness, and may have any number of layers that facilitate, at least in part, component connectivity and signal propagation. FIG. 2 shows circuit board profile (208) with dashed lines to represent that the circuit board is within network device (200) and, as such, circuit board profile (208) may be behind the front panel of network device (200) shown in FIG. 2.

As shown in FIG. 2, network device (200) includes indicator lights (204). In one or more embodiments, indicator lights (204) are components that emit light originating from LEDs. As an example, an LED may be a semiconductor component that emits light when an electric current passes through it. An LED may emit light of any color. An LED may emit light and not emit light in any alternating pattern. Colors and/or patterns of light emission from LEDs may be used, for example, to provide information to a user of network device (200). For example, indicator lights (204) may be used to indicate the status of any one or more components of network device (200).

The area on the front panel of network device (200) shown in FIG. 2 that is in front of circuit board profile (208) includes indicator lights (204) that are within the height of circuit board profile (208), thereby allowing the circuit board to function as a shroud for LEDs providing light to indicator lights (204). Thus, said area of the front panel is not unused, as it is in the example prior art network device (100) shown in FIG. 1. Techniques for implementing indicator lights (204) within circuit board profile (208) are discussed further in the descriptions of FIGS. 2-7, below.

As shown in FIG. 2, network device (200) includes additional airflow openings (210). In one or more embodiments, additional airflow openings (210) are similar to airflow openings (102), described above, but are in a different location on the front panel of network device (200). In one or more embodiments, there are more additional airflow openings (210) than the additional airflow openings (110) shown in FIG. 1. In one or more embodiments, the extra additional airflow openings result from re-locating the indicator lights from the position shown in FIG. 1 to being within circuit board profile (208), as shown in FIG. 2. In one or more embodiments, having extra additional airflow openings allows for increased airflow into and out of network device (200), thereby improving thermal management for network device (200).

The example network device shown in FIG. 2 mitigates the several problems described above with network device (100) shown in FIG. 1. First, the area of the front panel in front of circuit board profile (108) is used for the LEDs, rather than being unused. Additionally, the indicator lights (104) used as indicator lights for network device (100) are located in line with the profile of the circuit board and generally parallel to the circuit board. This location eliminates the additional infrastructure needed to facilitate the LEDs used for indicator lights, such as, for example, shrouds needed to shield light emitted from the LEDs and provided to the indicator lights. Moreover, the connections from the circuit board to LEDs that provide light to the indicator lights (204) do not require space (not shown) on the circuit board that could otherwise be used for components and connections used for operation of network device (200), as said connections are instead located at the edge of the circuit board, which is generally unused in devices such as network device (100) of FIG. 1. Such placement improves the ease of circuit board design, and may reduce or eliminate the need for longer signal traces to facilitate the LEDs, thereby improving signal integrity. Lastly, the location of indicator lights (204) within circuit board profile (208) allows extra space on the front panel to be used for extra additional airflow openings. In the example shown in FIG. 2, there are more additional airflow openings (210) than were possible in the network device (100).

While FIG. 2 shows a configuration of components, other configurations may be used without departing from the scope of embodiments described herein. Accordingly, embodiments disclosed herein should not be limited to the configuration or orientation of components shown in FIG. 2.

Figure 3:
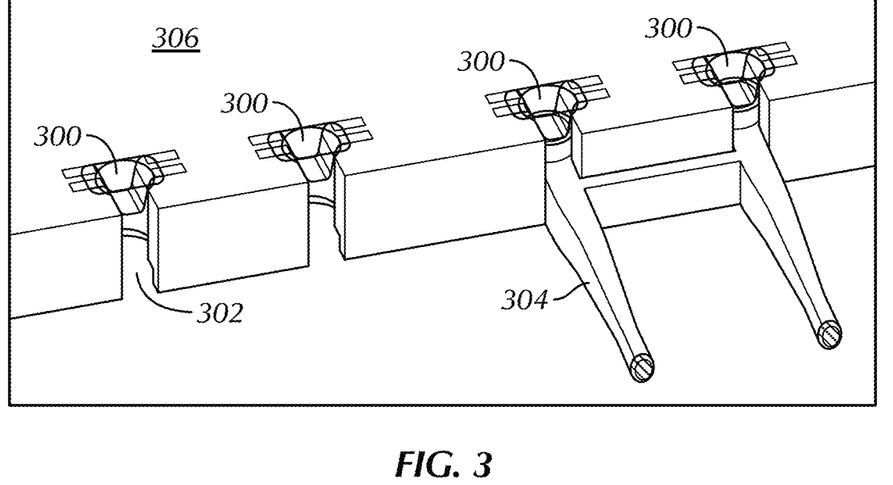
FIG. 3 shows perspective view of light emitting diodes and lightpipes disposed within the profile of a circuit board, and other features, in accordance with one or more embodiments described herein.

FIG. 3 shows perspective view of light emitting diodes and lightpipes disposed within the profile of a circuit board, and other features, in accordance with one or more embodiments described herein. Specifically, FIG. 3 shows a closer perspective view of a circuit board (306), at the circuit board (306) edge. As shown in FIG. 3, the circuit board (306) includes reverse mounted LEDs (300), an example hole and cutout (302) and lightpipes (304). Each of these components is described below.

In one or more embodiments, circuit board (306) is a circuit board substantially similar to the circuit board having the circuit board profile (208) shown in FIG. 2. As such, circuit board (306) is within a network device (e.g., network device (200) shown in FIG. 2). Circuit board (306) may have any number of included or attached features or components (not shown) that facilitate, at least in part, operation of a network device. The particular view of circuit board (306) shown in FIG. 3 is a view of the top of the circuit board, which may be a surface of the circuit board that is oriented to face the top of a network device.

In one or more embodiments, reverse mounted LEDs (300) are mounted to the top surface of circuit board (306). In one or more embodiments, a reverse mounted LED (300) is an LED configured to be mounted to a surface with the light-emitting portion of the LED directed into a cutout or hole in said surface, rather than away from the surface. In one or more embodiments, reverse mounted LEDs (300) are mounted to a top surface (which may be referred to as a first surface) of circuit board (306) using any surface mount technology suitable for reverse mounting an LED to the surface of a circuit board.

In one or more embodiments, the edge of circuit board (306) shown, in part, in FIG. 3 includes any number of holes and cutouts (e.g., hole and cutout (302)). In one or more embodiments, a hole, as used herein, is a hole in circuit board (306) near the edge of the circuit board that is adapted to receive the light from a reverse mounted LED surface mounted above the hole. In one or more embodiments, a cutout, as used herein, refers to an opening in circuit board (306) that extends from a hole to the edge of circuit board (306).

In one or more embodiments, a hole and cutout (302) in circuit board (306) may have mounted therein lightpipes (304). In one or more embodiments, a lightpipe is any conduit through which light may travel. In one or more embodiments, a lightpipe may be configured to re-direct the path of light emitted into one end and emitted out of the other end. As an example, a first end of a lightpipe may be within a hole in circuit board (306) and generally coaxial with the hole, such that a reverse mounted LED surface mounted at the hole emits light into an end of the lightpipe. A lightpipe may further include an interior feature suitable for re-directing the path of such light, such as, for example, optical technology (e.g., a mirror). As an example, a mirror within the lightpipe may receive light emitted into a first end of the lightpipe, and re-direct the light in a different direction out of a second end of the lightpipe. As an example, the lightpipe may include a mirror positioned to reflect incoming light 90 degrees. In one or more embodiments, the portion of the lightpipe that receives the light from a reverse mounted LED is substantially parallel to the edge of circuit board (306), and substantially perpendicular to the surfaces of circuit board (306) which the edge is between. In one or more embodiments, the portion of the lightpipe that emits light (e.g., to facilitate indicator lights of a network device) is substantially perpendicular to the edge of the circuit board (306), and substantially parallel to the surfaces of the circuit board, which the edge is between.

In one or more embodiments, a lightpipe used as described herein may be a single lightpipe that is not coupled to any other lightpipe. Additionally or alternatively, lightpipes used in embodiments described herein may be mechanically coupled to one or more other lightpipes, as is shown via the two lightpipes (304) in FIG. 3. Such coupling may, for example, ease the manufacturing process, as more than one lightpipe at a time may be coupled to circuit board (306).

While FIG. 3 shows a configuration of components, other configurations may be used without departing from the scope of embodiments described herein. Accordingly, embodiments disclosed herein should not be limited to the configuration or orientation of components shown in FIG. 3.

Figure 4:
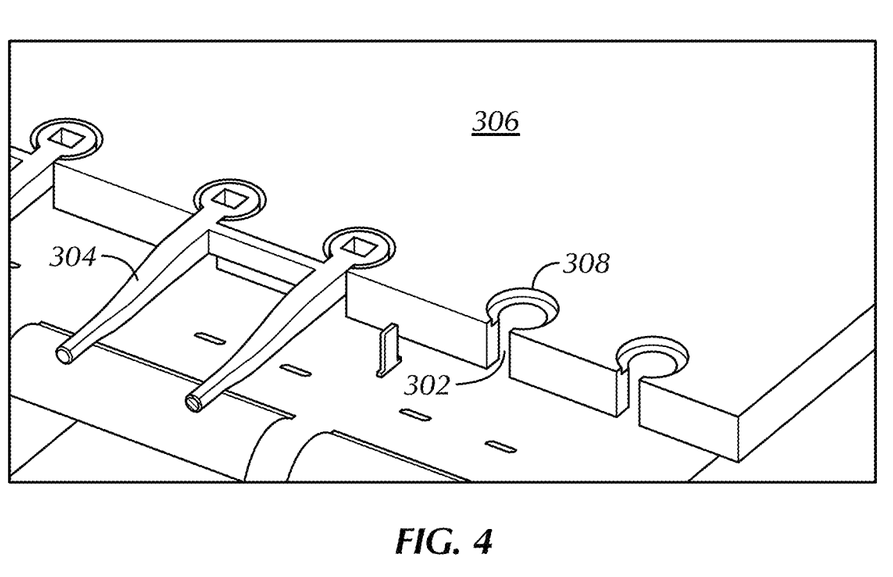
FIG. 4 shows reverse perspective view of light emitting diodes and lightpipes disposed within the profile of a circuit board (CB), and other features, in accordance with one or more embodiments described herein.

FIG. 4 shows reverse perspective view of light emitting diodes and lightpipes disposed within the profile of a circuit board (CB), and other features, in accordance with one or more embodiments described herein. As shown in FIG. 4, circuit board (306) includes hole and cutout (302), counterbore (308), and is coupled to lightpipes (304).

In one or more embodiments, the view of circuit board (306) shown in FIG. 4 is reverse of the view shown in FIG. 3. As such, FIG. 4 shows a bottom, or second, surface of circuit board (306). Lightpipes (304) shown in FIG. 4 are substantially similar to the lightpipes shown in FIG. 3. Hole and cutout (302) is substantially similar to the holes and cutouts shown in FIG. 3.

In one or more embodiments, circuit board (306) includes counterbore (308). In one or more embodiments, a counterbore (308) is a geometrical feature that is generally coaxial with a hole in circuit board (306), has a larger diameter, and has one side at a surface (e.g., the bottom surface) of circuit board (306). In one or more embodiments, counterbore (308) is adapted such that when one or more lightpipes are pressed into circuit board (306) (e.g., during a manufacturing process), the lightpipes are necessarily stopped by the interior edge of counterbore (308). In one or more embodiments, the counterbores (308) may prevent the one or more lightpipes from being pressed too far into circuit board (306), and thereby potentially dislodging, at least in part, a reverse mounted LED mounted on the opposite surface of circuit board (306).

While FIG. 4 shows a configuration of components and features, other configurations may be used without departing from the scope of embodiments described herein. Accordingly, embodiments disclosed herein should not be limited to the configuration or orientation of components and features shown in FIG. 4.

Figure 5:
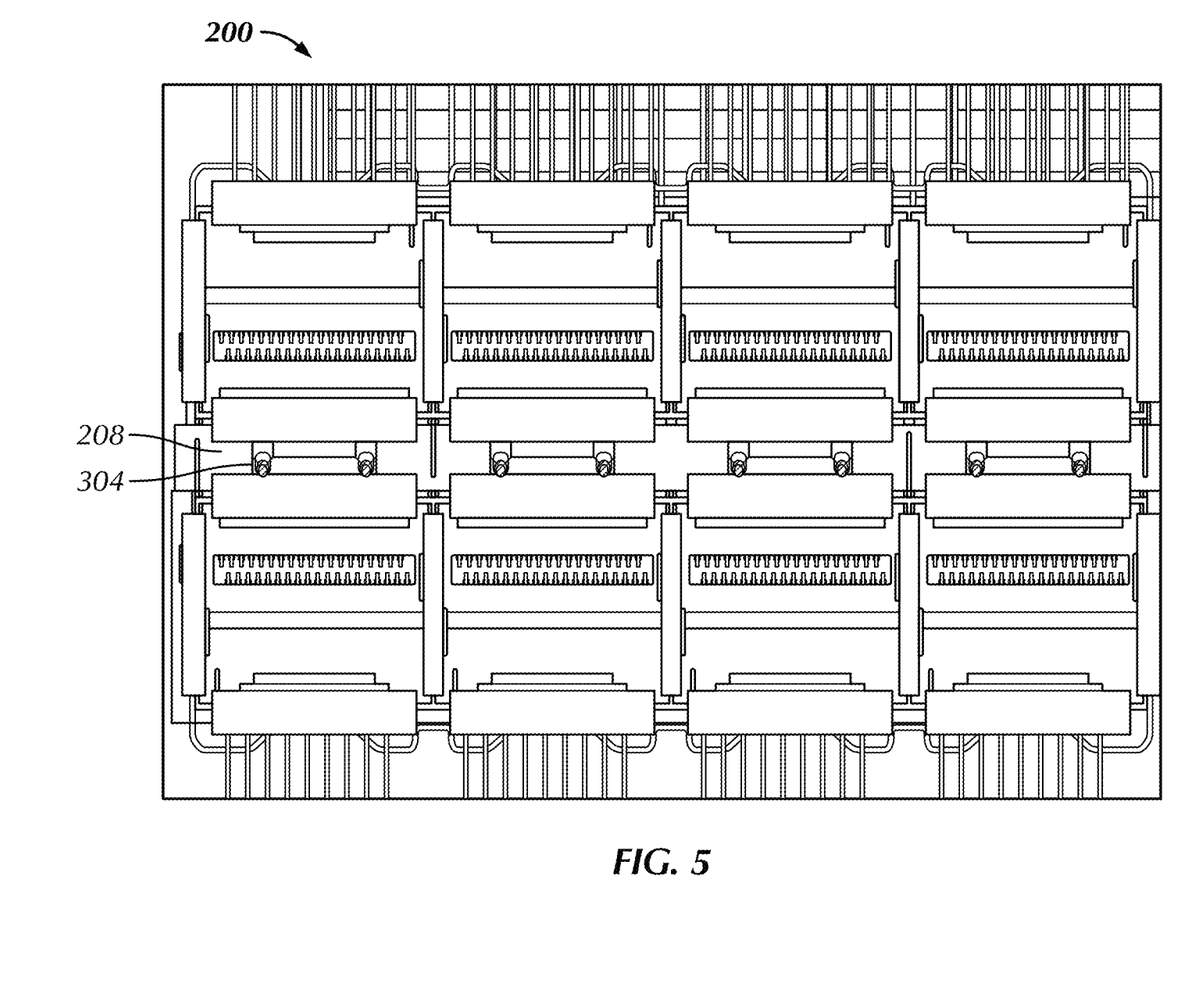
FIG. 5 shows a front view of a network device with the front panel removed in accordance with one or more embodiments described herein.

FIG. 5 shows a front view of a network device with the front panel removed in accordance with one or more embodiments described herein. As shown in FIG. 5, network device (200) includes circuit board profile (208) and lightpipes (304). In one or more embodiments, FIG. 5 shows the circuit board profile (208) in the context of the network device (200) with the front panel not shown to avoid obscuring the components behind the front panel. In one or more embodiments, the circuit board profile (208) is at the edge of a circuit board within network device (200), and may be of any thickness. In one or more embodiments, the lightpipes are substantially similar to the lightpipes described above in the descriptions of FIG. 3 and FIG. 4. FIG. 5 shows an embodiment in which the lightpipes extend away from the edge of the circuit board within circuit board profile (208). As such, in one or more embodiments, the circuit board serves as a shroud for any light emitted from the LEDs that emit light into lightpipes (304) and/or emitted from lightpipes (304). In one or more embodiments, though not shown in FIG. 5, the position of the lightpipes allow for the light emitted therefrom to be emitted from the front panel of network device (200) through openings adapted for that purpose, thereby using an otherwise unused portion of the front panel of network device (200).

While FIG. 5 shows a configuration of components, other configurations may be used without departing from the scope of embodiments described herein. Accordingly, embodiments disclosed herein should not be limited to the configuration or orientation of components shown in FIG. 5.

Figure 6:
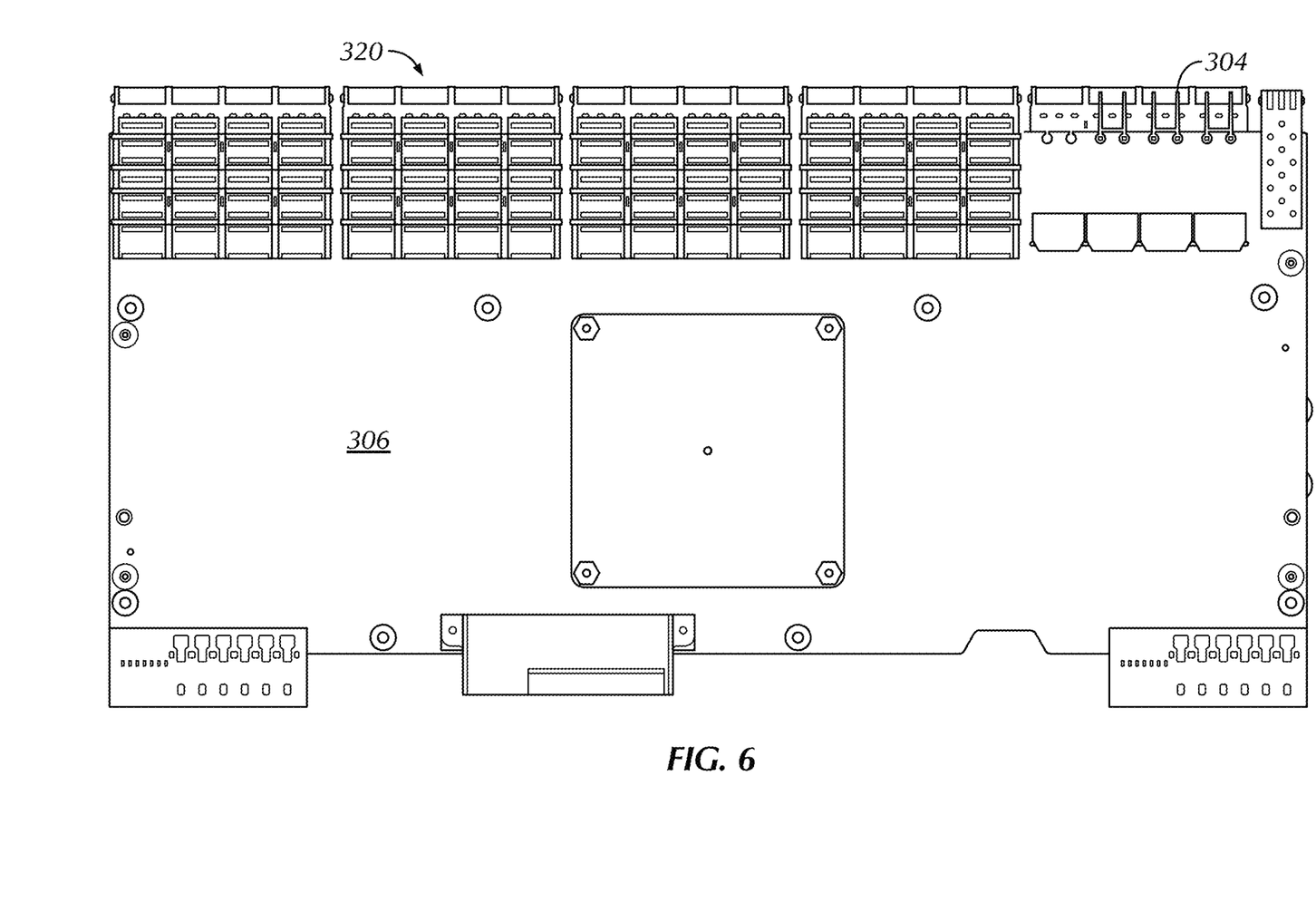
FIG. 6 shows a top view of a circuit board in accordance with one or more embodiments described herein.

FIG. 6 shows a top view of a circuit board in accordance with one or more embodiments described herein. Lightpipes (304) and circuit board (306) are substantially similar to like-named and/or like-numbered components discussed in the descriptions of FIGS. 3-5, above. FIG. 6 shows circuit board (306) in context of various other components of a network device, such as cages for optical transceivers (320). In the example embodiment shown in FIG. 6, the optical cages (320) above lightpipes (304) are omitted in order to show the position of lightpipes (304) below such optical component cages, and at the edge of circuit board (306). In one or more embodiments, the position at the edge of circuit board (306) is an otherwise unused portion of the circuit board. As such, the location of the holes and cutouts, and the lightpipes therein, do not use space on circuit board (306) that could otherwise be used for components and features that are more critical to the operation of the network device. The location at the circuit board edge may allow the circuit board design process to be simpler, and allow for shorter signal traces, which may improve signal integrity.

While FIG. 6 shows a configuration of components, other configurations may be used without departing from the scope of embodiments described herein. Accordingly, embodiments disclosed herein should not be limited to the configuration or orientation of components shown in FIG. 6.

Figures 7, 8:
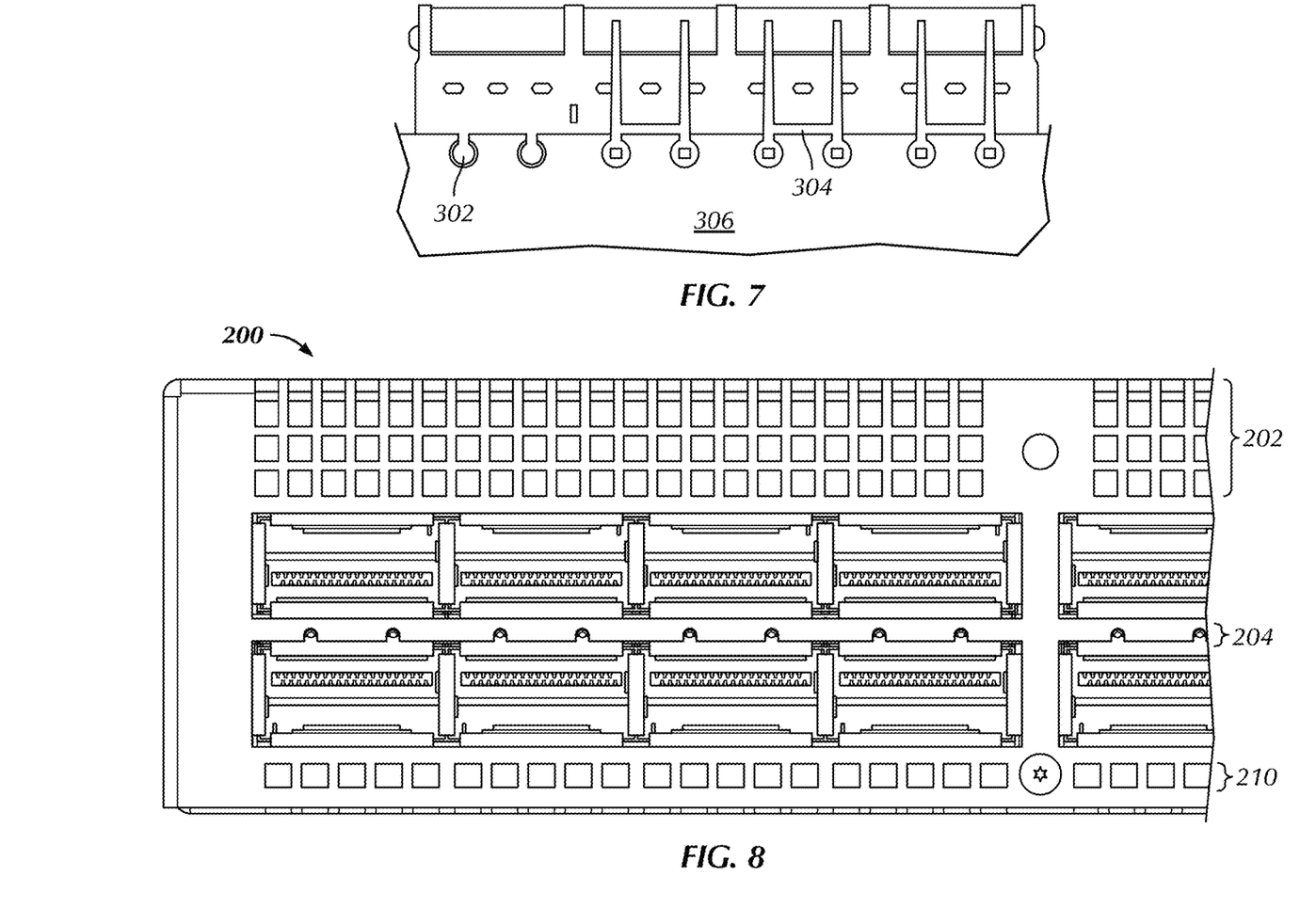
FIG. 7 shows a top view of a circuit board portion in accordance with one or more embodiments described herein.
FIG. 8 shows an example in accordance with one or more embodiments described herein.

FIG. 7 shows a top view of a circuit board portion in accordance with one or more embodiments described herein.

FIG. 7 shows a closer view of the portion of FIG. 6 that shows lightpipes (304). As shown in FIG. 7, there are eight hole and cutout (302) features at the edge of circuit board (306). Six of the hole and cutout features are shown with lightpipes therein, with the lightpipes (304) being mechanically coupled in pairs of two lightpipes.

While FIG. 7 shows a configuration of components, other configurations may be used without departing from the scope of embodiments described herein. Accordingly, embodiments disclosed herein should not be limited to the configuration or orientation of components shown in FIG. 7.

FIG. 8 shows an example front panel of a network device (200) in accordance with one or more embodiments described herein. The example of FIG. 8 is for explanatory purposes only and not intended to limit the scope of embodiments described herein. Additionally, while the example shows certain aspects of embodiments described herein, all possible aspects of such embodiments may not be illustrated in this particular example.

Referring to FIG. 8, indicator lights (204) are located in a portion of a front panel of network device (200) that exists in front of a circuit board (not shown) within network device (200). The indicator lights allow light from ends of lightpipes (not shown) to be emitted from the front panel. Within the network device, the lightpipes have been pressed into the bottom of the circuit board, stopped by counterbores in the holes in the circuit board. One end of the lightpipes is adapted to receive light from reverse mounted LEDs mounted to the top surface of the circuit board using surface mount technology. Light emitted from the LEDs travels into an end of the lightpipe that is coaxial with the hole in the circuit board, and is reflected 90 degrees to be emitted from an end of the lightpipes parallel to the surfaces of the circuit board, and perpendicular to the edge of the circuit board, thereby being emitted from the indicator lights shown (204) shown in FIG. 8. FIG. 8 also shows a quantity of additional airflow openings (210) that is greater than a lesser quantity that would be possible if indicator lights (204) were not aligned with the circuit board within network device (200).

In the above description, numerous details are set forth as examples of embodiments described herein. It will be understood by those skilled in the art, and having the benefit of this Detailed Description, that one or more embodiments of embodiments described herein may be practiced without these specific details and that numerous variations or modifications may be possible without departing from the scope of the embodiments described herein. Certain details known to those of ordinary skill in the art may be omitted to avoid obscuring the description.

In the above description of the figures, any component described with regard to a figure, in various embodiments described herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named or similarly numbered components. Additionally, in accordance with various embodiments described herein, any description of the components of a figure is to be interpreted as an optional embodiment, which may be implemented in addition to, in conjunction with, or in place of the embodiments described with regard to a corresponding like-named or similarly numbered component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information may travel may be considered an operative connection.

Additionally, directional words (e.g., top, bottom, above, below, etc.) may be used as an adjective to a noun or as a relative location of an element or component. The use of directional words is not meant to imply any required orientation within any two dimensional plane or three dimensional space. For example, the use of the words or phrases "top", "bottom", "left", "right", or "forehead facing" are meant to convey relative positions, rather than any fixed position. The use of such words may instead convey a spatial relationship between a component and some other component, or to some external element, such as a forehead of a human. For example, the "top" of one component (e.g., the "surface" of the component) may refer a portion of the component that is intended to be connected, at least in part, to a portion of another component, which may, in turn, be referred to as the "bottom" of the other component.

Additionally, as used herein, the term "substantially parallel" includes all values of angles within 10% of parallel. As an example, any element that is substantially parallel to any other element may form at least one angle with the other element that is within a range from 81 degrees to 99 degrees.

While a limited number of embodiments have been described herein, those skilled in the art, having benefit of this disclosure, will appreciate that other embodiments can be devised which do not depart from the scope of the embodiments described herein. Accordingly, the scope of embodiments described herein should be limited only by the attached claims.

What is claimed is:

1. A system for positioning indicator lights of a network device, the system comprising:
   a circuit board of the network device comprising:
      a circuit board edge positioned behind a front panel of the network device;
      a first surface;
      a second surface; and
      a side of the circuit board edge positioned between the first surface and the second surface;
   a hole through the circuit board positioned near the circuit board edge;
   a first cutout extending from at least a portion of the hole to the side of the circuit board edge;
   a light-emitting diode (LED) coupled to the first surface of the circuit board and adapted to emit light into the hole; and a lightpipe disposed in the hole of the circuit board adapted to receive light emitted from the LED into a first end of the lightpipe,
wherein the lightpipe is adapted to direct the light from a second end of the lightpipe toward an indicator light opening in the front panel of the network device.

2. The system of claim 1, wherein the second end of the lightpipe is adapted to fit within the indicator light opening of the front panel of the network device.

3. The system of claim 1, wherein the LED is a reverse-mounted LED.

4. The system of claim 3, wherein the LED is coupled to the circuit board using surface mount technology (SMT).

5. The system of claim 1, wherein the lightpipe comprises a mirror adapted to reflect the light from the LED in a different direction within the lightpipe.

6. The system of claim 5, wherein the different direction is ninety degrees from a direction in which the light is emitted into the hole.

7. The system of claim 1, wherein the lightpipe is pressed into the circuit board from the second surface of the circuit board.

8. The system of claim 1, wherein the second end of the lightpipe extends away from the side of the lightpipe and is substantially parallel to the first surface and the second surface.

9. The system of claim 1, wherein the hole comprises a geometry change adapted to prevent the lightpipe from dislodging the LED when pressed into the second surface of the circuit board.

10. The system of claim 9, wherein the geometry change is part of a counterbore.

11. The system of claim 1, wherein the circuit board is a printed circuit board.

12. The system of claim 1, wherein a body of the circuit board is adapted to shield the light from other components of the circuit board.

13. The system of claim 1, wherein the LED is adapted to emit light in different patterns to indicate a status of a component of the network device.

14. The system of claim 1, wherein the LED is adapted to emit light of different colors based on a status of a component of the network device.

15. The system of claim 1, wherein the front panel comprises a plurality of airflow openings located in a first region of the front panel.

16. The system of claim 15, wherein the front panel further comprises a plurality of additional airflow openings located in a second region of the front panel that is separate from the first region and from a third region in which indicator lights are located.

17. A system for positioning indicator lights, the system comprising:
a circuit board edge region of a circuit board;
a first surface of the circuit board edge region;
a second surface of the circuit board edge region; and
a side of the circuit board edge region positioned between the first surface and the second surface;
a hole through the circuit board positioned near the circuit board edge region;
a first cutout extending from at least a portion of the hole to the side of the circuit board;
a light-emitting diode (LED) coupled to the first surface of the circuit board and adapted to emit light into the hole; and
a lightpipe disposed in the hole of the circuit board adapted to receive light emitted from the LED into a first end of the lightpipe.

18. The system of claim 17, wherein the lightpipe is adapted to direct the light from a second end of the lightpipe toward an indicator hole opening of a device.

19. The system of claim 17, wherein the LED is a reverse-mounted LED.

20. The system of claim 17, wherein the lightpipe comprises a mirror adapted to reflect the light from the LED in a different direction within the lightpipe.

* * * * *